(12) United States Patent
Akram et al.

(10) Patent No.: US 7,061,092 B2
(45) Date of Patent: Jun. 13, 2006

(54) HIGH-DENSITY MODULARITY FOR ICS

(75) Inventors: Salman Akram, Boise, ID (US); Jerry M. Brooks, Caldwell, ID (US)

(73) Assignee: Micron Technology, Inc., Boise, ID (US)

(*) Notice: Subject to any disclaimer, the term of this patent is extended or adjusted under 35 U.S.C. 154(b) by 403 days.

(21) Appl. No.: 10/289,549

(22) Filed: Nov. 6, 2002

(65) Prior Publication Data

US 2003/0064547 A1 Apr. 3, 2003

Related U.S. Application Data

(62) Division of application No. 09/241,177, filed on Feb. 1, 1999, now Pat. No. 6,815,251.

(51) Int. Cl.
*H01L 23/48* (2006.01)

(52) U.S. Cl. .................. 257/690; 257/678; 257/685; 438/107

(58) Field of Classification Search ........... 257/678, 257/685, 690; 438/107, 110
See application file for complete search history.

(56) References Cited

U.S. PATENT DOCUMENTS

| | | |
|---|---|---|
| 4,649,418 A | 3/1987 | Uden |
| 4,725,924 A | 2/1988 | Juan |
| 4,731,645 A | 3/1988 | Parmentier et al. |
| 4,748,495 A | 5/1988 | Kucharek |
| 4,873,615 A | 10/1989 | Grabbe |
| 4,991,000 A | 2/1991 | Bone et al. |
| 4,992,849 A | 2/1991 | Corbett et al. |
| 4,992,850 A | 2/1991 | Corbett et al. |
| 4,996,587 A | 2/1991 | Hinrichsmeyer et al. |
| 5,012,323 A | 4/1991 | Farnworth |
| 5,016,138 A | 5/1991 | Woodman |
| 5,045,921 A | 9/1991 | Lin et al. |
| 5,107,328 A | 4/1992 | Kinsman |
| 5,128,831 A | 7/1992 | Fox, III et al. |
| 5,137,836 A | 8/1992 | Lam |
| 5,155,067 A | 10/1992 | Wood et al. |
| 5,182,632 A | 1/1993 | Bechtel et al. |
| 5,239,198 A | 8/1993 | Lin et al. |
| 5,239,747 A | 8/1993 | Ewers |
| 5,243,497 A | 9/1993 | Chiu |
| 5,255,156 A | 10/1993 | Chang |
| 5,280,192 A | 1/1994 | Kryzaniwsky |
| 5,280,193 A | 1/1994 | Lin et al. |
| 5,291,061 A | 3/1994 | Ball |
| 5,323,060 A | 6/1994 | Fogal et al. |
| 5,365,409 A | 11/1994 | Kwon et al. |
| 5,378,981 A | 1/1995 | Higgins, III |
| 5,418,687 A | 5/1995 | Chen |
| 5,420,751 A | 5/1995 | Burns |
| 5,422,435 A | 6/1995 | Takiar et al. |
| 5,424,652 A | 6/1995 | Hembree et al. |
| 5,438,216 A | 8/1995 | Juskey et al. |
| 5,438,224 A | 8/1995 | Papageorge et al. |

(Continued)

*Primary Examiner*—Amir Zarabian
*Assistant Examiner*—Christy Novacek
(74) *Attorney, Agent, or Firm*—TraskBritt (57) ABSTRACT

A high-density multi-chip module and method for construction thereof, wherein a plurality of integrated circuit dice with at least one row of generally central bond pads is bonded in a staggered flip-chip style to opposite sides of a metallized substrate. The bond pads of each die are positioned over a through-hole in the substrate, and the bond pads are wire-bonded from one side of the substrate to circuitry on the opposing side of the substrate. Application of a glob-top sealant into the through-holes seals the bond pads and bond wires. A ball grid array may be formed in the peripheral area surrounding the dice on one side of the substrate, or an edge connection may be incorporated for connection to an external circuit.

38 Claims, 11 Drawing Sheets

| U.S. PATENT DOCUMENTS | | |
|---|---|---|
| 5,448,165 A | 9/1995 | Hodge et al. |
| 5,455,445 A | 10/1995 | Kurtz et al. |
| 5,461,544 A | 10/1995 | Ewers |
| 5,465,470 A | 11/1995 | Vongfuangfoo et al. |
| 5,468,655 A | 11/1995 | Greer |
| 5,475,317 A | 12/1995 | Smith |
| 5,477,067 A | 12/1995 | Isomura et al. |
| 5,477,082 A | 12/1995 | Buckley, III et al. |
| 5,480,840 A | 1/1996 | Barnes et al. |
| 5,484,959 A | 1/1996 | Burns |
| 5,495,398 A | 2/1996 | Takiar et al. |
| 5,502,289 A | 3/1996 | Takiar et al. |
| 5,600,183 A | 2/1997 | Gates, Jr. |
| 5,602,420 A | 2/1997 | Ogata et al. |
| 5,637,912 A | 6/1997 | Cockerill et al. |
| 5,677,569 A | 10/1997 | Choi et al. |
| 5,811,879 A | 9/1998 | Akram |
| 5,835,357 A | 11/1998 | Swamy et al. |
| 5,998,860 A | 12/1999 | Chan et al. |

HIGH-DENSITY MODULARITY FOR ICS

CROSS-REFERENCE TO RELATED APPLICATION

This application is a divisional of application Ser. No. 09/241,177, filed Feb. 1, 1999, now U.S. Pat. No. 6,815,251, issued Nov. 9, 2004.

BACKGROUND OF THE INVENTION

1. Field of the Invention

This invention relates generally to integrated circuit (IC) or semiconductor devices. More particularly, the invention pertains to integrated circuit configurations which provide high-density modules for mounting on circuit boards and other host apparatus.

2. State of the Art

Integrated circuit semiconductor devices (ICs) are small electronic circuits formed on the surface of a wafer of semiconductor material such as silicon. The ICs are fabricated in plurality as part of a wafer. The wafer is then subdivided into discrete IC chips or dice, and then further tested and assembled for customer use through various well-known individual die testing and packaging techniques, including lead frame packaging, Chip-On-Board (COB) packaging, and flip-chip packaging (FCP). Depending upon the die and wafer sizes, each wafer is divided into a few dice or as many as several hundred or more than one thousand discrete dice, each of which becomes an IC package.

The continuing demand for miniaturization has resulted in the development of integrated circuits on dice of very small size. The corresponding miniaturization of external circuitry has not proceeded at the same rate. Thus, there is a need for devices (including the interconnecting circuitry) of increasingly greater density.

Multi-chip modules have typically followed the convention of earlier, single chip packages, in that the reverse sides of bare dice or chips are mounted on a substrate such as a printed circuit board (PCB), leaving the active surface exposed for wire-bonding to the substrate or lead frame. Such is exemplified in U.S. Pat. No. 4,873,615 of Grabbe. Typically, dice are attached to one side only of the substrate, as in U.S. Pat. Nos. 4,992,849 and 4,992,850 of Corbett et al.

Where the device encompasses dice on both sides of the substrate, the reverse sides of the dice are conventionally attached to the substrate, as illustrated in U.S. Pat. No. 5,239,198 of Lin et al.

Stacked groups of packaged devices, often called cubes, have been developed, as exemplified in U.S. Pat. No. 5,016,138 of Woodman, U.S. Pat. No. 5,128,831 of Fox, III et al., U.S. Pat. No. 5,291,061 of Ball, U.S. Pat. No. 5,420,751 of Burns, U.S. Pat. No. 5,455,445 of Kurtz et al., U.S. Pat. No. 5,602,420 of Ogata et al., and U.S. Pat. No. 5,637,912 of Cockerill et al. In these references, each non-conductive substrate has one or more IC dies attached to one side only, or where dies are attached to both sides of the substrate, not more than one die is so attached on its active surface. In variants where there is no existing substrate between adjacent dice or packages, the packages have peripheral external leads.

In U.S. Pat. No. 5,291,061 of Ball and U.S. Pat. No. 5,323,060 of Fogal et al., multiple dice are stacked and wire-bonded to circuitry on a substrate with progressively longer wires.

Dice having bond pads, i.e. on the active surface, complicate the construction of multi-chip modules, particularly when wire-bonding is the connection method of choice. As taught in U.S. Pat. No. 5,012,323 of Farnworth, U.S. Pat. Nos. 5,422,435, 5,495,398 and 5,502,289 of Takiar et al., and U.S. Pat. No. 5,600,183 of Gates, Jr., bonding with wire or other conductor necessitates that the stacked dice be of progressively smaller size.

In U.S. Pat. No. 4,996,587 of Hinrichsmeyer et al. and U.S. Pat. No. 5,107,328 of Kinsman, a package is shown with a die within a recess in a carrier. The carrier has shelves which extend over the die, leaving a slot through which the die is wire-bonded to conductive traces on the opposite surface of the shelves. U.S. Pat. No. 5,677,569 of Choi et al. shows a stacked package in which holes in the substrate permit wire-bonding of die pads to the upper surface of the substrate.

In U.S. Pat. No. 5,438,224 of Papageorge et al. and U.S. Pat. No. 5,477,082 of Buckley, III et al., a pair of dice is shown attached on its active surfaces to opposite sides of an intermediate layer such as a substrate. In both references, the terminals on the dice are directly coupled to terminals on the same side of the intermediate member by e.g. solder balls. The opposed dice are shown as being coextensive.

BRIEF SUMMARY OF THE INVENTION

In one aspect, the invention comprises a method for forming a high-density multi-chip module (MCM) from a plurality of integrated circuits (ICs) in the form of bare dice with one or more rows of conductive bond pads. The bond pads of each die are preferably formed in a row or rows generally spanning the active surface. The dice are mounted on opposing sides of a substrate in a staggered flip-chip style and wire-bonded through-slots to conductors on the opposite side of the substrate. Metallization in the form of conductive leads on both surfaces of the substrate is thus connected by wire bonds to the dice and to an electrical Input/Output (I/O) means such as a ball-grid array (BGA), edge connector, etc. for connection to an external circuit.

In another aspect, the invention comprises the multi-chip module formed by the method.

In one preferred form, an array of solder balls is formed on one surface of the substrate, in the peripheral area surrounding the die or dice mounted on that surface. Alternatively, a pin-grid array may be used. The multi-chip module may be readily attached by surface mounting on a circuit board, for example.

In another preferred form, an edge connector such as a socket connector as well-known in the art may be used.

The bonded wires within the through-slots in the substrate are preferably surrounded with a "glob-top" sealant material following testing. Thus, the wire connections are sealed by glob-top on one side of the substrate and by the die bonding material on the opposite side of the substrate. A minimum amount of glob-top material is required.

The module construction permits testing of each die after wire-bonding and easy removal and replacement of a defective die, if necessary, without removal of any encapsulant material. The construction is such that the bonded conductive wires are, prior to glob top application, protected from physical damage by their location within through-slots in the substrate and between or adjacent opposing dies. The opportunity for damage during die testing or die replacement prior to wire encapsulation is greatly reduced.

The module of the invention has a high density, inasmuch as it is formed as an array of bare dice rather than encapsulated packages of greater size. Dice are mounted on both sides of a substrate to form the module, and coplanar dies may be closely spaced, leaving room enough for forming the wire-bonds within the through-slots.

The method of the invention may be employed to surface mount bare dice on e.g. a printed circuit board of an electronic component.

BRIEF DESCRIPTION OF THE DRAWINGS

The invention is illustrated in the following exemplary figures, wherein the drawings are not necessarily to scale.

DESCRIPTION OF THE ILLUSTRATED EMBODIMENTS

An exemplary embodiment of the invention is illustrated in drawing FIGS. 1 through 8 and is shown as a high-density module 10 having two IC dies 12A, 12B mounted on a first side 16 of a substrate 20. One IC die 14A is shown on the opposite (second) side 18 of the substrate, in a staggered position relative to dies 12A, 12B. While the figures show a total of three dies 12A, 12B, 14A (referred to collectively as "dice 12, 14," respectively) in the module, any number may be mounted to substrate 20 to form a dense IC module for use as a memory device, for example. In a spacially balanced module, the numbers of dice on the first and second sides 16, 18 will differ by one.

The dice 12, 14 are attached to the substrate 20 by an adhesive layer 38, which may be any non-conductive adhesive or adhesive tape as known in the art.

Each of the IC dies 12A, 12B and 14A is a bare (unpackaged) die with one or more adjacent rows of bond pads 22 on an active surface 24 thereof. In drawing FIGS. 1 and 2, the bond pads 22 of dies on the opposite side are not visible, being covered by a flowable, hardenable, polymeric glob-top 40. In drawing FIGS. 5 to 8, two rows of bond pads 22 are shown spanning the minor dimension 26 of the dies (see FIG. 1). Alternatively, the bond pads 22 may be configured in a row or rows anywhere on the active surface 24, but preferably along a centerline 42 of a major dimension 28 or minor dimension 26, or even at an oblique angle with the major dimension 28. Preferably, the dice 12, 14 should be aligned so that the rows of bond pads 22 are in a parallel, spaced-apart relationship.

The substrate 20 is shown with elongate through-slots 30A and 30B, each through-slot passing through the substrate between the first side 16 and the second side 18. The through-slots 30A, 30B are configured to provide access from the opposite side 18 of the substrate 20 for wire-bonding the bond pads 22 to connection sites 32 of a conductor pattern 34 on the substrate. The dice 12A and 12B are spaced a distance 36 apart, leaving room for the through-slot 30C therebetween.

As shown in drawing FIGS. 2 and 4 through 8, die 14A is mounted on the opposite side 18 of the substrate 20 between through-slots 30A and 30B. Like dice 12A and 12B, die 14A has its active surface 24 bonded to the substrate 20. Through-slot 30C encompasses the bond pads 22 of die 14A and is configured to provide access to the bond pads from the first side 16 of the substrate 20, i.e. from the side opposite the side to which the die 14A is attached.

Conductor patterns 34A, 34B are incorporated on each side 16, 18, respectively, of the substrate 20, having connection sites 32A, 32B (referred to collectively as connection sites 32) adjacent each through-slot 30A, 30B, 30C (referred to collectively as through-slots 30) for wire-bonding to bond pads 22 with conductive wires 44. The conductor patterns 34A, 34B and connection sites 32 are not shown in drawing FIGS. 1 through 4 for the sake of clarity, but are depicted in drawing FIGS. 5 through 8.

Figure 9:
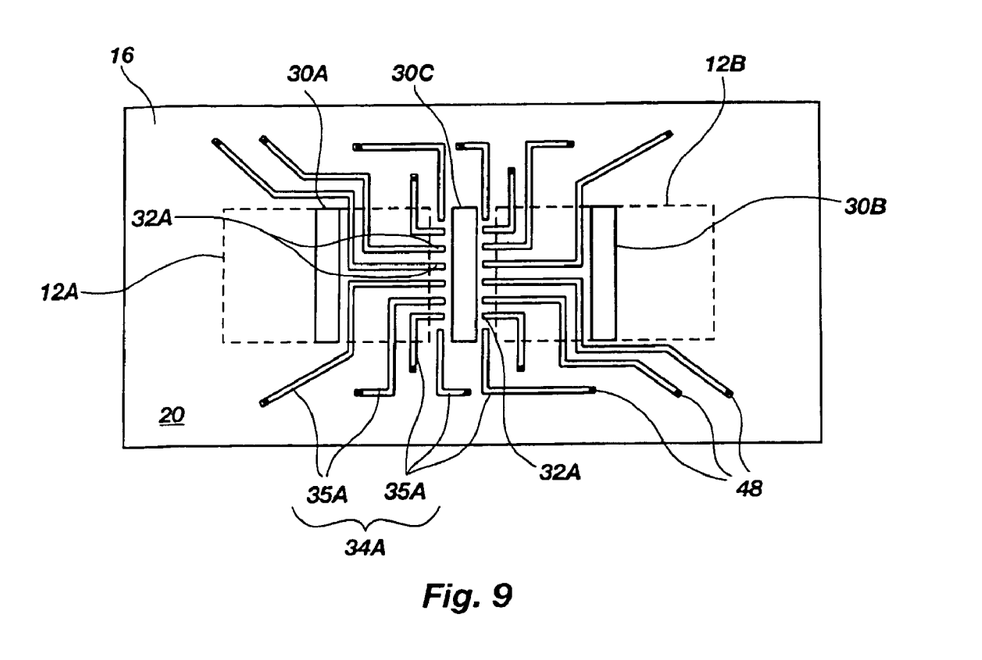
FIG. 9 is a top view of a high-density IC module of the invention, in an intermediate stage of fabrication.
Figure 10:
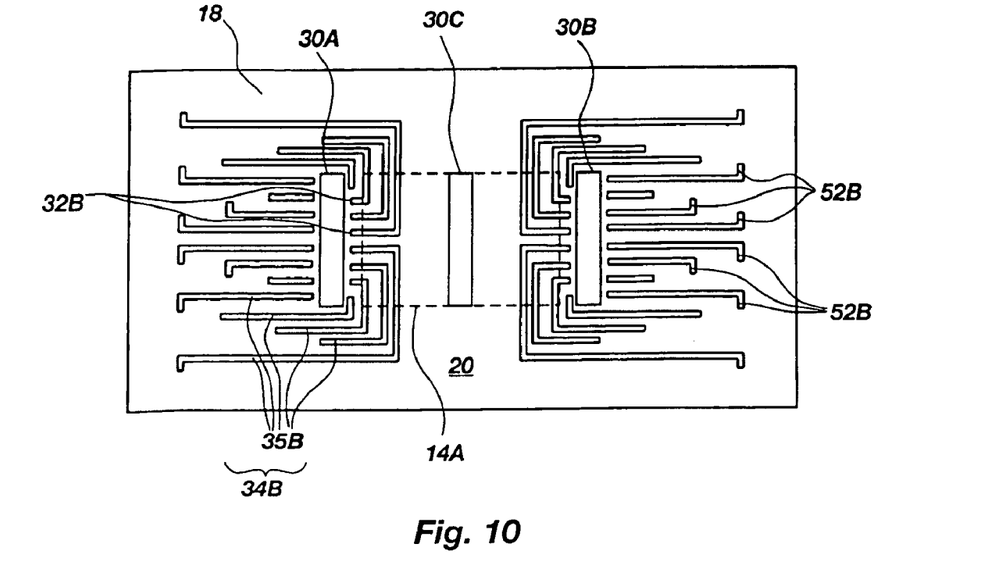
FIG. 10 is a bottom view of a high-density IC module of the invention, in an intermediate stage of fabrication.

An exemplary conductor pattern 34A is shown on first substrate side 16 in drawing FIG. 9. The conductor pattern 34A has connection sites 32A for wire-bonding to die 14A (not shown in FIGS. 9 and 10) through through-slot 30C. In the example shown, the conductors 35A of conductor pattern 34A are also connected to solder balls 50 on side 18 (see FIG. 2) which comprise input/output connections for connecting the dice 12, 14 to external circuitry. The solder balls 50 comprise a ball-grid-array in a peripheral area 46 surrounding the die or dice. The balls are configured to be surface mounted to conductive traces on a larger substrate such as a circuit board, not shown. The input/output connections may also comprise a pin-grid-array (PGA), such an array being well known in the art.

The conductor pattern 34A on side 16 of the substrate 20 is interconnected with the solder balls 50 or with conductor pattern 34B on side 18 by conductive vias 48 passing through the substrate.

The conductor pattern 34B has connection sites 32B for wire-bonding to dice 12A and 12B (not shown in FIGS. 9 and 10) through through-slots 30A and 30B, respectively. In the example shown, the conductors 35B of conductor pattern 34B have outer ends 52B which are connected to solder balls 50 on the same side 18 (see FIG. 2).

As shown in drawing FIGS. 1 through 10, the module 10 has a separate solder ball 50 conductively connected to each bond pad 22 of the three dice 12A, 12B, 14A. Where the dice are to have common conductors, the number of solder balls 50 or other input/output connection lines will be much decreased.

Figure 11:
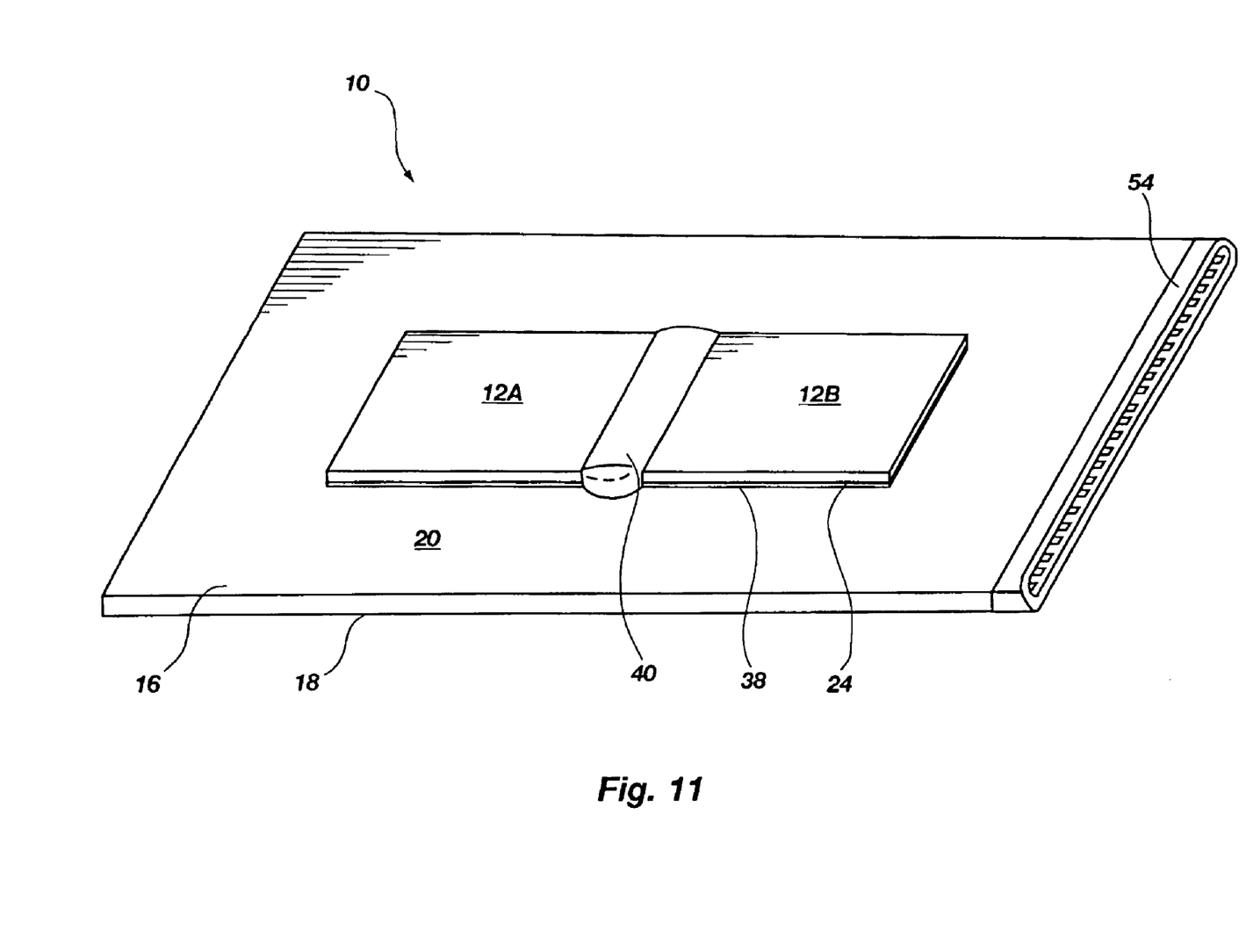
FIG. 11 is a perspective top view of another embodiment of a high-density IC module of the invention.
Figure 12:
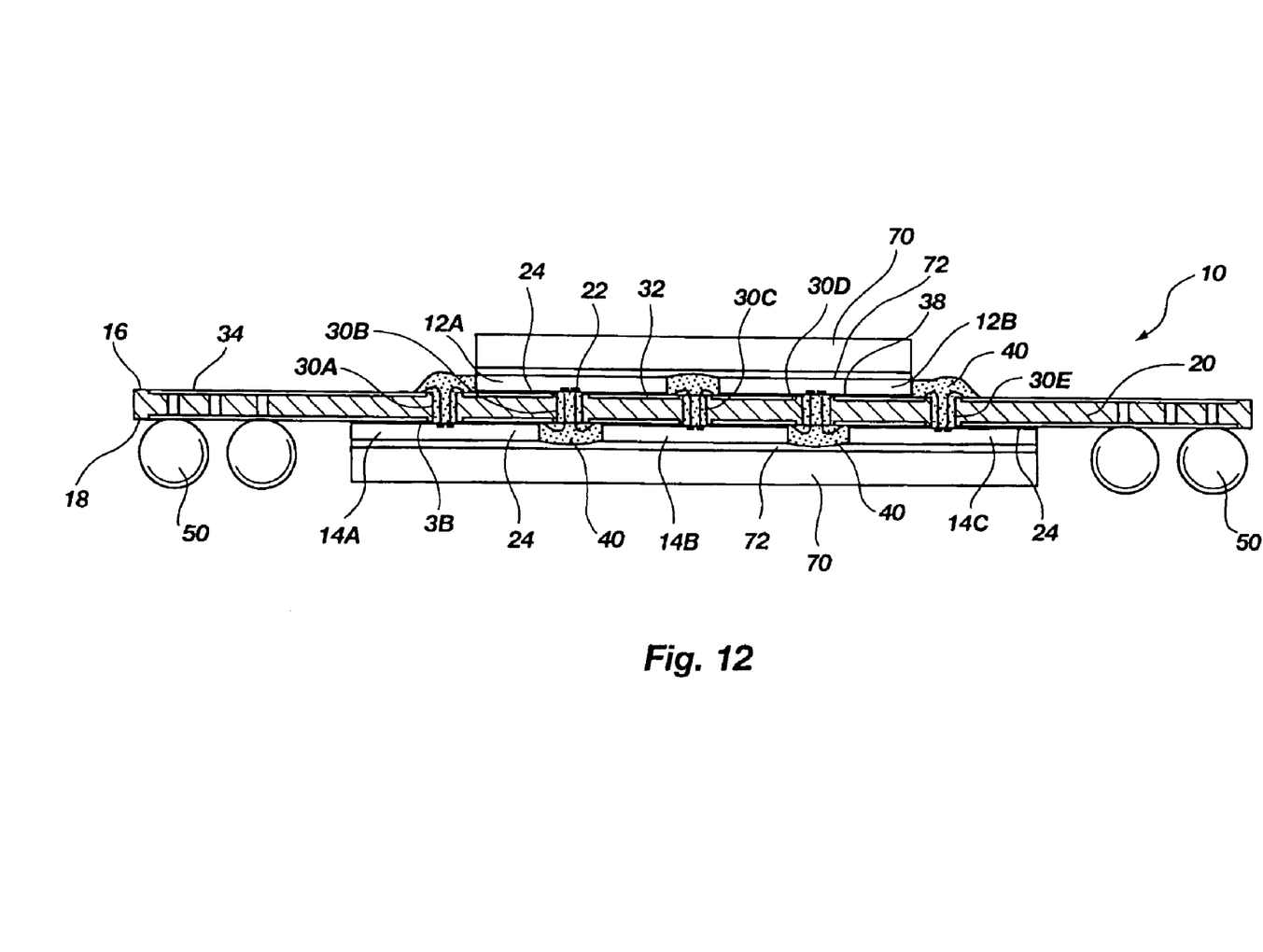
FIG. 12 is a cross-sectional edge view of another embodiment of a high-density IC module of the invention.
Figure 13:
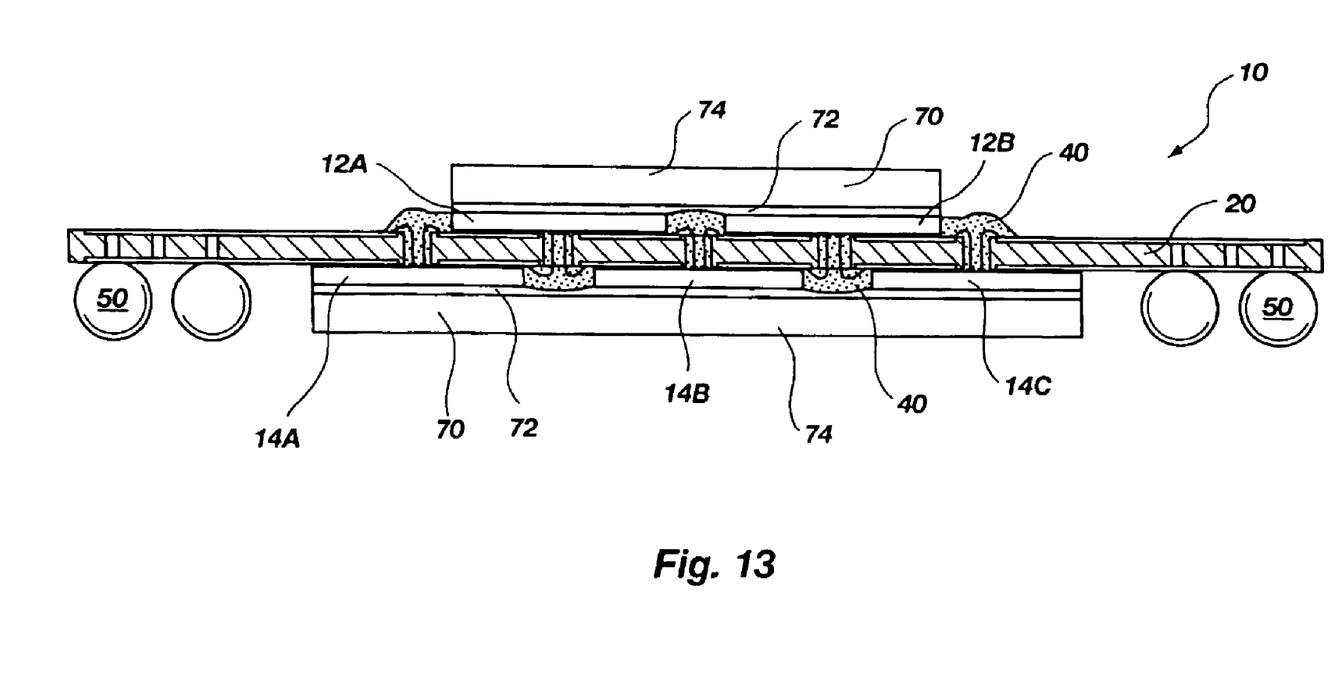
FIG. 13 is a cross-sectional edge view of another embodiment of a high-density IC module of the invention.
Figure 14:
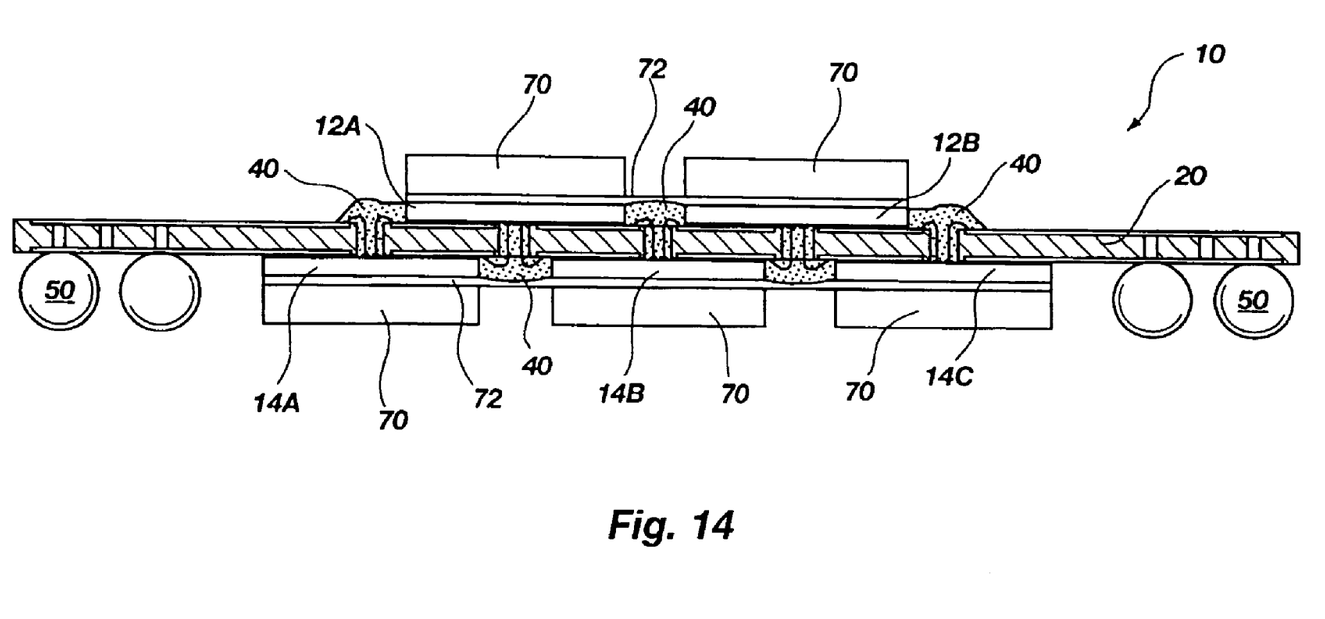
FIG. 14 is a cross-sectional edge view of another embodiment of a high-density IC module of the invention.
Figure 15:
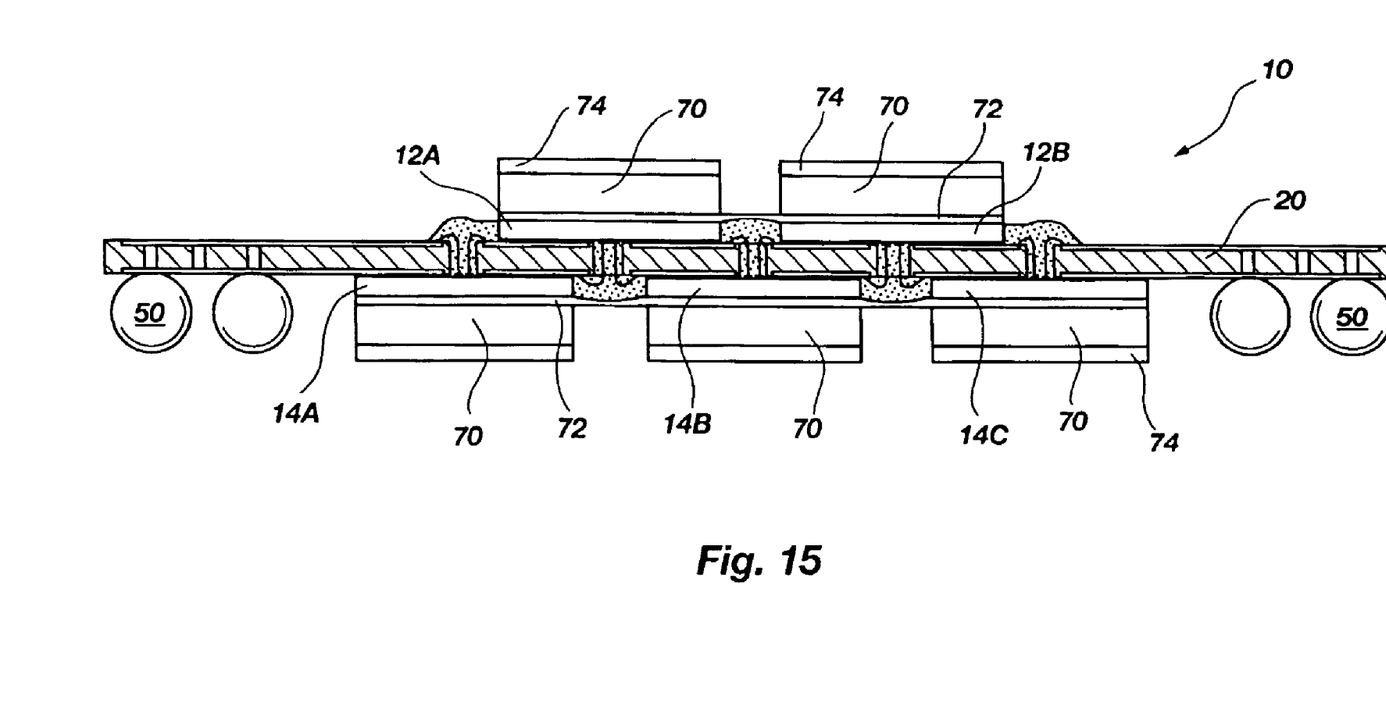
FIG. 15 is a cross-sectional edge view of another embodiment of a high-density IC module of the invention.

A socket type connector 54 may be used instead of the ball-grid-array of balls 50, or pin-grid-array. As shown in drawing FIG. 11, a socket type connector 54 may be provided which permits vertical placement of the module on a circuit board, or cable connection. The conductor patterns 34A, 34B will vary from those of drawing FIGS. 9 and 10 in that the conductors 35A and 35B will extend to the socket type connector 54 rather than to an array of solder balls 50. Methods for making such patterns and connections are well known in the art.

Turning now specifically to drawing FIGS. 5 through 8, several variations in the through-slot configuration are illustrated.

Figure 1:
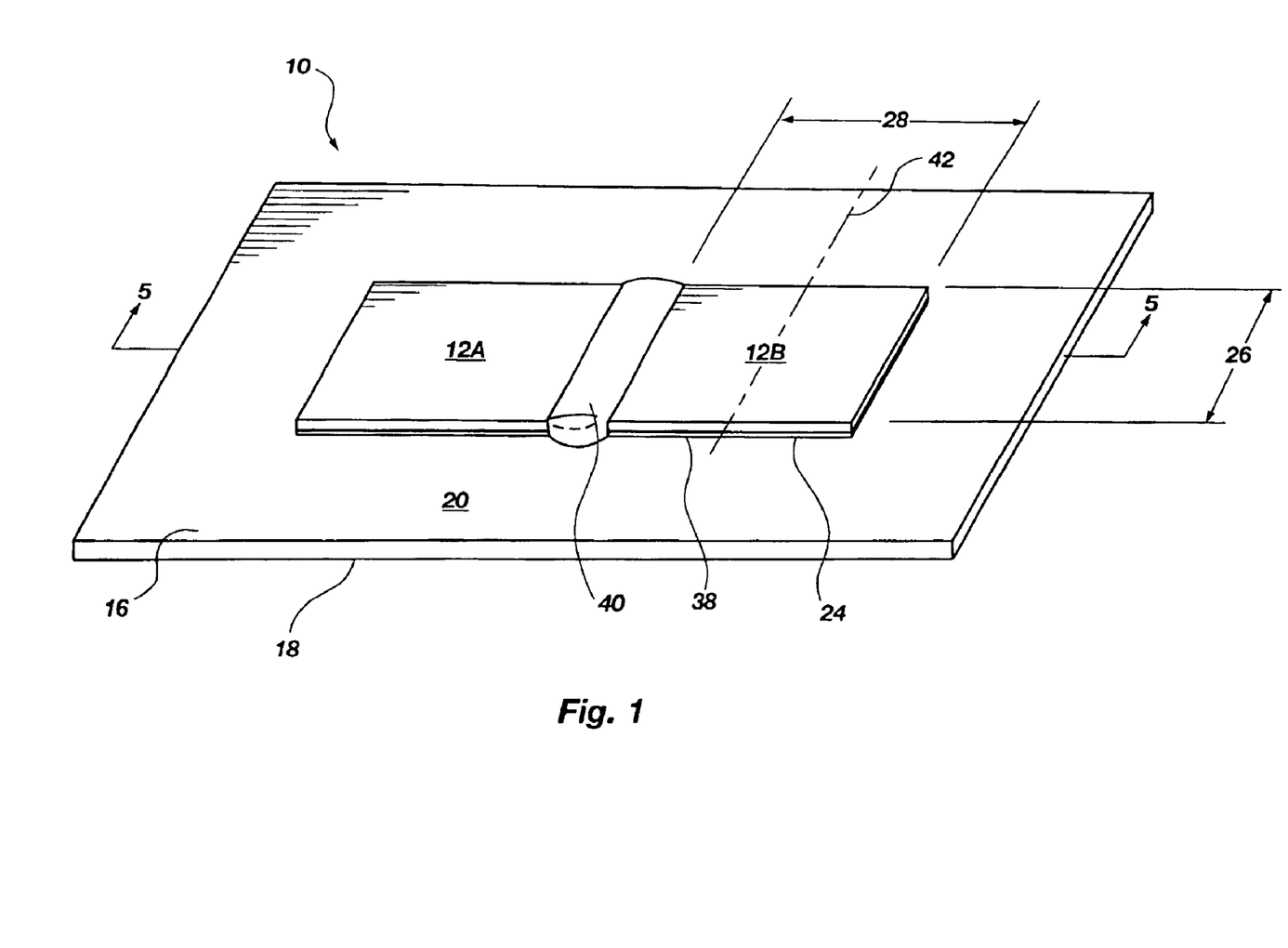
FIG. 1 is a perspective upper view of a high-density IC module of the invention.
Figure 2:
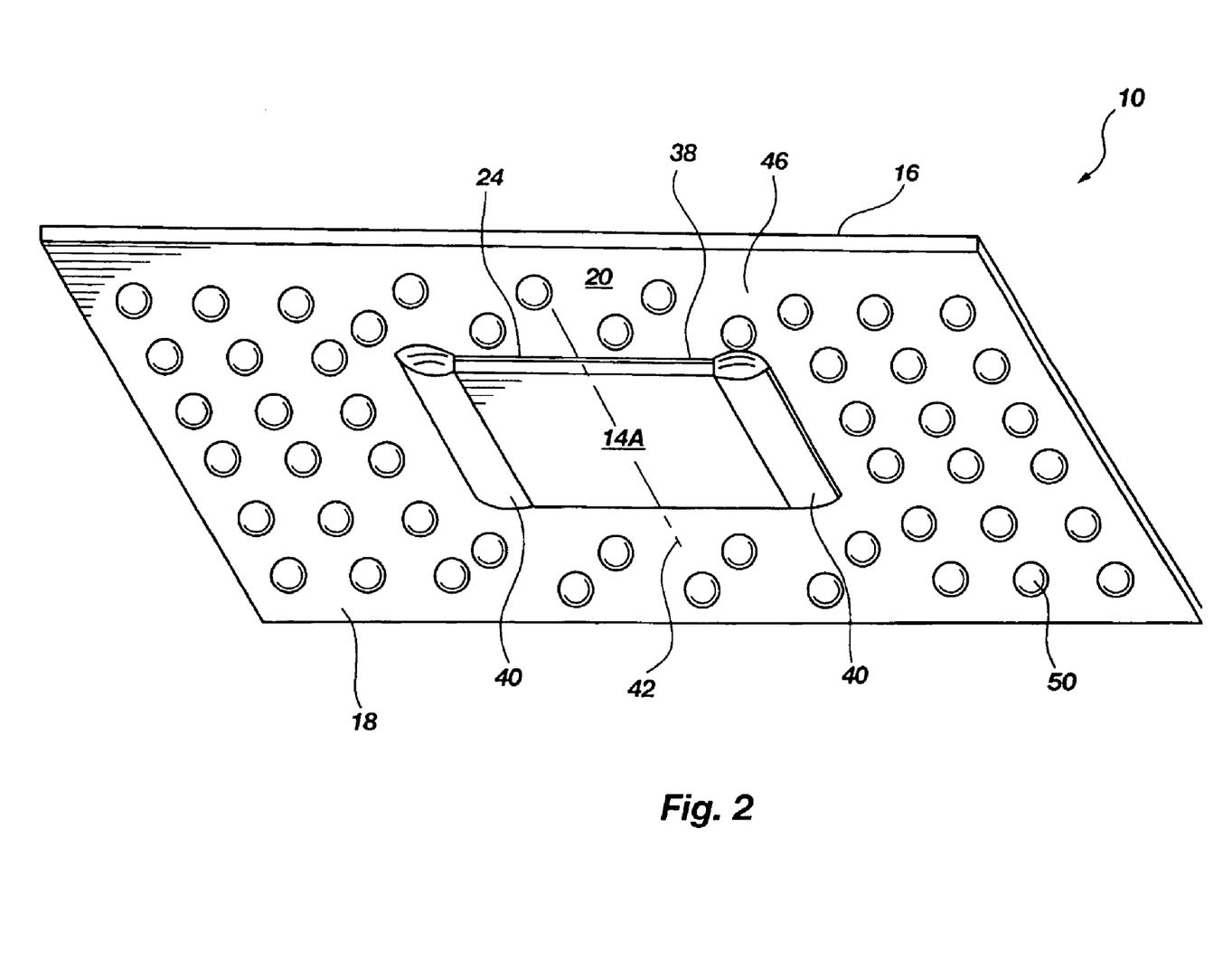
FIG. 2 is a perspective lower view of a high-density IC module of the invention.
Figure 3:
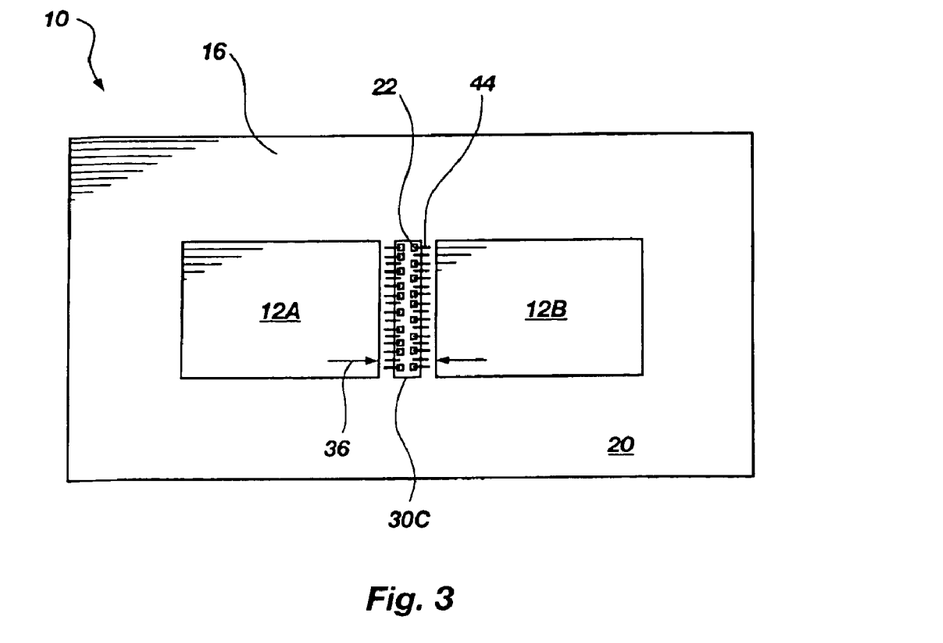
FIG. 3 is a top view of a high-density IC module of the invention, in an intermediate stage of fabrication.
Figure 4:
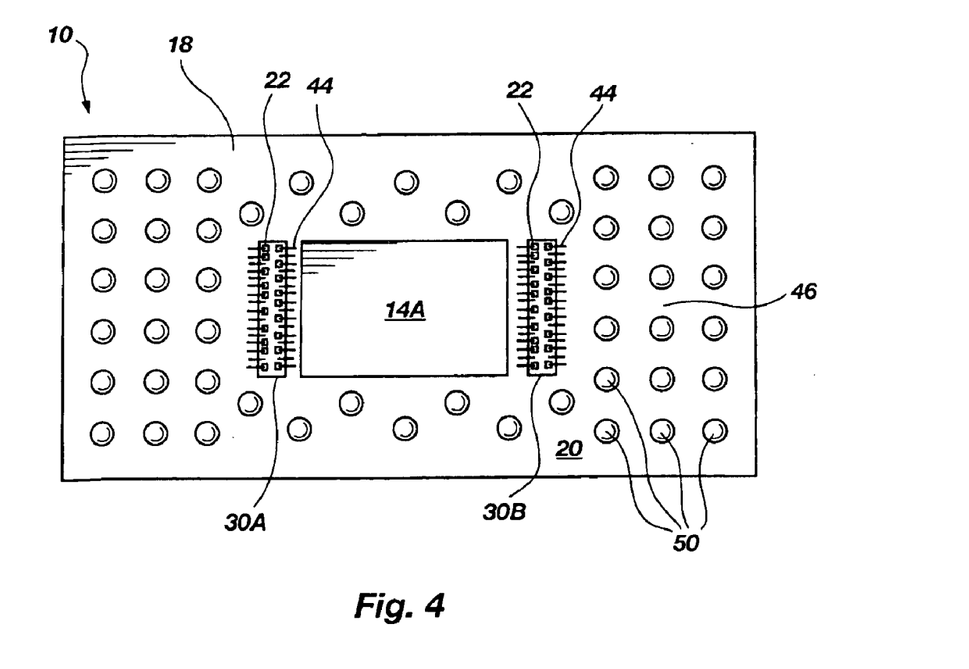
FIG. 4 is a bottom view of a high-density IC module of the invention, in an intermediate stage of fabrication.
Figure 5:
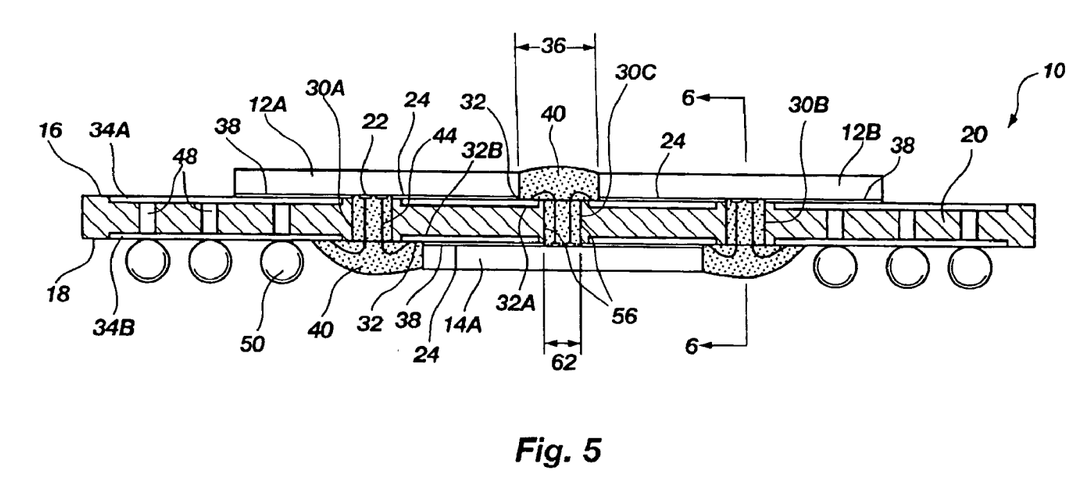
FIG. 5 is a cross-sectional edge view of a high-density IC module of the invention, as taken along line 5—5 of FIG. 1.
Figure 6:
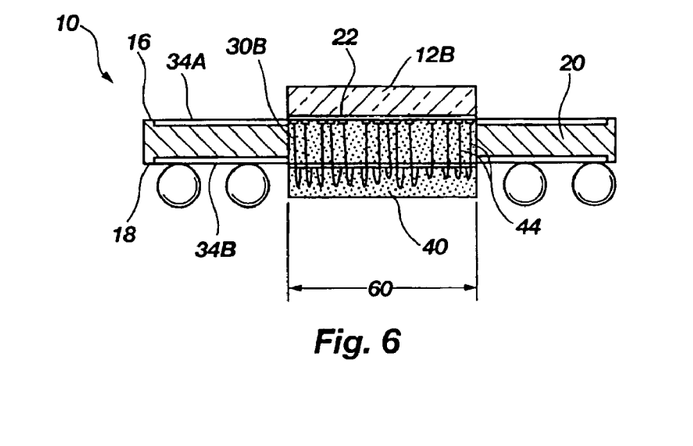
FIG. 6 is a cross-sectional edge view of a high-density IC module of the invention, as taken along line 6—6 of FIG. 5.

A simple through-slot configuration in drawing FIGS. 5 and 6 has flat walls 56. The walls 56 are shown as parallel, but in an alternative arrangement, they may be beveled relative to each other. The through-slots 30A, 30B and 30C are shown with wires 44 bonded to bond pads 22 and connection sites 32A, 32B on substrate sides 16 and 18, respectively. The slot width 62 is such that it exposes the bond pads 22 and permits entrance of a wire bonding machine head for bonding the conductive wires 44. The slot length 60 exceeds the length of the row of bond pads 22, providing space for performing the wire-bonding.

Figure 7:
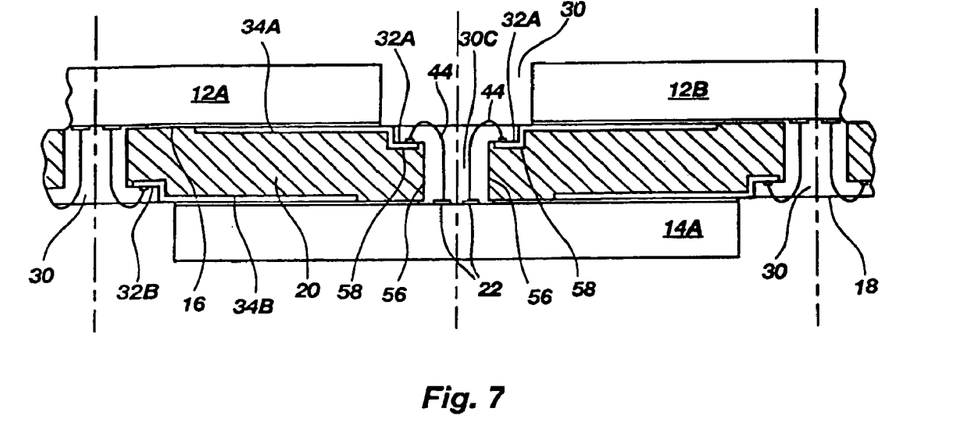
FIG. 7 is a partial cross-sectional view of another embodiment of a high-density IC module of the invention.
Figure 8:
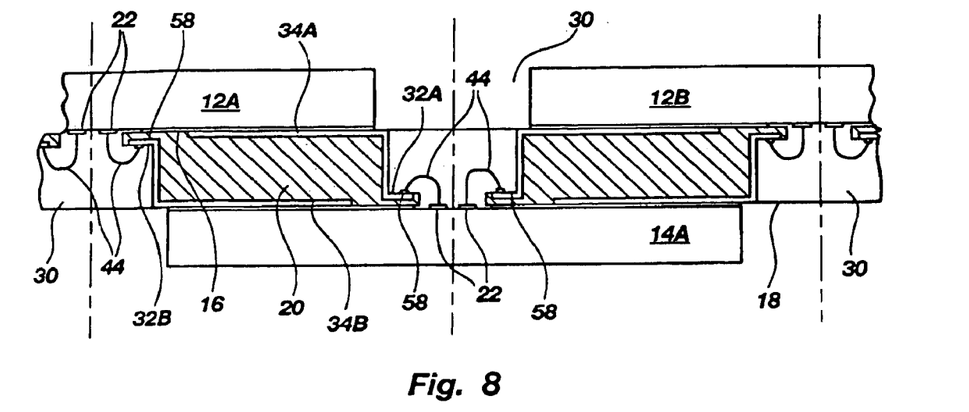
FIG. 8 is a partial cross-sectional view of another embodiment of a high-density IC module of the invention.

Drawing FIGS. 7 and 8 correspond generally to drawing FIG. 5, but show different through-slot configurations, and do not show the glob-top 40. As depicted in drawing FIG. 7, through-slot 30C is formed with outwardly extending stepped surfaces 58 in opposed walls 56. These stepped surfaces 58 face the opposite side 16 of the substrate 20, and connection sites 32A on the stepped surfaces 58 are wire-bonded to bond pads 22 on die 14A with wires 44. In this configuration, stepped surfaces 58 are only slightly recessed from the substrate side 16.

In drawing FIG. 8, each through-slot step 58 is positioned much deeper in the substrate 20, shortening the length of the wires 44.

In drawing FIGS. 7 and 8, the wires 44 are effectively buried within the substrate 20, making them less prone to physical damage during handling of the module.

The method of making the module 10 of the invention comprises the following steps:

A plurality of integrated circuit dice 12, 14 is procured or fabricated. The integrated circuit dice 12, 14 are formed with an active surface 24 with one or more rows of conductive bond pads 22 thereon.

A planar substrate 20 having first side 16 and opposing side 18 is formed, and at least three through-slots 30 are formed in the substrate wherein each through-slot has a length 60 and width 62 sufficient to expose the rows of bond pads 22 of a die 12 or 14 bonded to the substrate to overlie the through-slot. The through-slot may be of uniform width 62, or may include a stepped surface(s) 58.

Conductor patterns 34A, 34B are formed on sides 16,18, respectively, of the substrate 20, such as by a lithographic metallization process or by other methods known in the art. The conductor patterns 34A, 34B include conductors 35A, 35B having one end configured as a wire-connection site 32 adjacent a through-slot 30, and the other end is configured for attachment to an input/output connection. Where the through-slot 30 is stepped, the wire-connection sites 32 are positioned on the stepped surfaces 58.

The formation of the through-slots 30 and the conductor patterns 34A, 34B may be in any order.

An input/output connection means is added to the module 10 and may comprise an array of solder balls 50 or pins, or may be a socket type edge connector 54.

Dice 12, 14 are then mounted on both sides 16, 18 of the substrate 20 with an adhesive layer 38. Each die is mounted so that all of its bond pads 22 to be connected are positioned within a through-slot 30 and are thus exposed on the opposite side of the substrate 20 between two other dice for wire-bonding.

Bond pads 22 of each die 12, 14 are wire-bonded by conductive wires 44 to the connection sites 32 of the conductor patterns 34A, 34B.

Typically, each die 12, 14 and/or all dice collectively are tested for operability before the through-slots 30 are filled with glob-top 40 to encapsulate and seal the wires 44 therein and spaces between adjacent dice 12, 14.

Optionally, the module, including the otherwise exposed die surfaces and substrate, may be encapsulated with a polymeric material.

The module 10 as described has a high density. The effective density increases as the number of dice 12, 14 is increased. Both sides of the substrate 20 are utilized, and the modules 10 so formed may be surface bonded to both sides of a printed circuit board (PCB), for example. Furthermore, the method may be used as chip-on-board (COB) technology for attaching a plurality of bare dice 12, 14 to a mother board without prior encapsulation.

The wire protection provided by the through-slots 30 and dice 12, 14 enables the module 10 to be electrically tested prior to glob-top encapsulation without endangering the wires 44. This also enables easy and rapid removal and replacement of any defective die.

The method requires minimal glob-topping.

Additional advantages and modifications will readily be recognized by those skilled in the art. Referring to drawing FIGS. 12 through 15, other embodiments of the invention are illustrated having common elements of the inventions having the same numbers as used in drawings FIGS. 1 through 11 with heat sink members 70 having fins 74 thereon. Therefore, the invention in its broader aspects is not limited to the specific details, and representative devices, shown and described herein, but includes various modifications which may be made without departing from the spirit or scope of the general inventive concept and embodiments as defined by the appended claims and their equivalents.

What is claimed is:

1. A multi-chip module, comprising:
    a substrate having a first side and a second side and at least two elongate through-slots extending from the first side to the second side thereof, the at least two elongate through-slots each having a length and a width;
    electrical conductors formed on the first side and the second side of the substrate, the electrical conductors having connection terminals adjacent the at least two elongate through-slots for bonding portions of wires to bond pads exposed through the at least two elongate through-slots;
    electrical input/output connectors for connecting the electrical conductors to an external circuit;
    a first semiconductor die having an active surface with a plurality of bond pads thereon and a reverse surface, a portion of the active surface bonded to the first side of the substrate, at least one bond pad of the plurality of bond pads on the active surface of the first semiconductor die exposed through a through-slot of the at least two elongate through-slots in the substrate for bonding a portion of a wire to at least one of the electrical conductors on the second side of the substrate;

a second semiconductor die having an active surface with a plurality of bond pads thereon and a reverse surface, a portion of the active surface of the second semiconductor die bonded to the second side of the substrate, at least one bond pad of the plurality of bond pads thereon exposed through another through-slot of the at least two elongate through-slots in the substrate for wire-bonding to at least one of the electrical conductors on the first side of the substrate;

at least two conductive wires connecting at least two bond pads of the plurality of bond pads on the first semiconductor die and the second semiconductor die to at least two of the connection terminals, one of the at least two connection terminals located on the first side of the substrate and another of the at least two connection terminals located on the second side of the substrate, the first semiconductor die and the second semiconductor die positioned wherein a conductive wire connected thereto extends through a through-slot of the at least two elongate through-slots in the substrate; and a flowable, hardenable glob-top material in at least one of the through-slots, the material at least partially encapsulating at least one of the at least two conductive wires therein, the at least one of the at least two conductive wires electrically attached to the first semiconductor die, the glob-top material extending away from the through-slot towards the second semiconductor die, thereby contacting the second semiconductor die.

2. The multi-chip module of claim 1, further comprising a layer of polymeric sealant encapsulating a portion of the multi-chip module.

3. The multi-chip module of claim 1, wherein the first semiconductor die and the second semiconductor die are attached to the substrate at two different planes.

4. The multi-chip module of claim 1, wherein the electrical conductors on the first side of the substrate have connection terminals adjacent the through-slot of the at least two elongate through-slots in the substrate for wire-bonding to the plurality of bond pads on the first semiconductor die attached to the first side of the substrate, and the electrical conductors on the second side of the substrate have connection terminals adjacent the another through-slot of the at least two elongate through-slots for wire-bonding to the plurality of bond pads on the second semiconductor die attached to the first side of the substrate.

5. The multi-chip module of claim 1, wherein the electrical conductors comprise metallization patterns on the first and second sides of the substrate.

6. The multi-chip module of claim 1, further comprising:
conductive vias through the substrate connecting the electrical conductors on the first side and the second side of the substrate.

7. The multi-chip module of claim 1, wherein the electrical input/output connectors comprise a ball-grid-array of solder balls on one of the first and second sides of the substrate.

8. The multi-chip module of claim 1, wherein the electrical input/output connectors comprise an edge connector.

9. The multi-chip module of claim 1, wherein the electrical input/output connectors comprise a socket connector.

10. The multi-chip module of claim 1, wherein the glob-top material fills a space between the first and second semiconductor dice.

11. A multi-chip module, comprising:
a substrate having a first side, a second side, and a plurality of elongate through-slots extending from the first side to the second side thereof, the plurality of through-slots having a length and width;

electrical conductors formed on the first side and the second side of the substrate and having connection terminals adjacent the plurality of through-slots for wire-bonding to bond pads exposed through the plurality of through-slots;

electrical input/output connectors for connecting the electrical conductors to an external circuit;

a plurality of semiconductor dice, each semiconductor die of the plurality of semiconductor dice having an active surface having a plurality of bond pads thereon and a reverse surface, the active surface of some of the plurality of semiconductor dice bonded to the first side of the substrate, the plurality of bond pads of the some of the plurality of semiconductor dice exposed through a through-slot of the plurality of through-slots to the second side of the substrate for wire-bonding to the electrical conductors on the second side of the substrate, at least one semiconductor die of the plurality of semiconductor dice attached to the second side of the substrate, the plurality of bond pads of the at least one semiconductor die of the plurality of semiconductor dice exposed through a through-slot of the plurality of through-slots to the first side of the substrate for wire-bonding to the electrical conductors on the first side of the substrate;

conductive wires connecting the plurality of bond pads of each of the plurality of semiconductor dice to the connection terminals, each the semiconductor die of the plurality of semiconductor dice positioned having conductive wires connected thereto extending through a through-slot of the plurality of through-slots in a space between adjacent semiconductor dice on a side of the substrate opposite thereto; and a flowable, hardenable glob-top material in at least one of the through-slots, the material at least partially encapsulating at least one of the at least two conductive wires therein, the at least one of the at least two conductive wires electrically attached to one semiconductor die, the glob-top material extending away from the through-slot towards another semiconductor die, thereby contacting the another semiconductor die.

12. The multi-chip module of claim 11, further comprising a layer of polymeric sealant encapsulating the multi-chip module.

13. The multi-chip module of claim 11, wherein the plurality of semiconductor dice is attached in a biplanar configuration on the substrate.

14. The multi-chip module of claim 11, wherein the electrical conductors on the first side of the substrate have connection terminals adjacent alternate through-slots of the plurality of through-slots for wire-bonding to the plurality of bond pads on the at least one semiconductor die of the plurality of semiconductor dice attached to the second side of the substrate, and the electrical conductors on the second side of the substrate have connection terminals adjacent other through-slots of the plurality of through-slots for wire-bonding to the plurality of bond pads on some semiconductor dice of the plurality of semiconductor dice attached to the first side of the substrate.

15. The multi-chip module of claim 11, wherein the electrical conductors comprise metallization patterns on the first side and the second side of the substrate.

16. The multi-chip module of claim 11, further comprising conductive vias through the substrate connecting electrical conductors on opposite sides of the substrate.

17. The multi-chip module of claim 11, wherein the electrical input/output connectors comprise a ball-grid-array of solder balls on one of the first and second sides of the substrate, in a periphery thereof about the semiconductor dice bonded to the substrate.

18. The multi-chip module of claim 11, wherein the electrical input/output connectors comprise an edge connector.

19. The multi-chip module of claim 11, wherein the electrical input/output connectors comprise a socket connector.

20. The multi-chip module of claim 11, wherein a number of the at least one semiconductor die mounted on the second side of the substrate differs by one from a number of the plurality of semiconductor dice mounted on the first side of the substrate.

21. The multi-chip module of claim 11, wherein the length of the through-slots exceeds a length of the plurality of bond pads on a semiconductor die of the plurality of semiconductor dice.

22. The multi-chip module of claim 11, wherein each of the plurality of through-slots has uniform dimensions between the first side and the second side of the substrate.

23. The multi-chip module of claim 11, wherein the plurality of bond pads of a semiconductor die of the plurality of semiconductor dice is positioned along a centerline of the active surface thereof.

24. The multi-chip module of claim 11, wherein at least two semiconductor dice of the some of the plurality of semiconductor dice attached to the first side of the substrate lie in a first plane and at least two semiconductor dice of the plurality of semiconductor dice are attached to the second side of the substrate and lie in a second plane.

25. The multi-chip module of claim 11, further comprising a memory device wherein a majority of the plurality of semiconductor dice have internal circuits.

26. The multi-chip module of claim 11, wherein the width of a through-slot of the plurality of through-slots is greater at one of the first and second sides of the substrate.

27. The multi-chip module of claim 26, wherein the through-slot of the plurality of through-slots is stepped between the first side and second side of the substrate.

28. The multi-chip module of claim 26, wherein the width of the through-slot of the plurality of through-slots is configured to provide a step intermediate the first side and the second side of the substrate.

29. The multi-chip module of claim 28, wherein the connection terminals of the electrical conductors are positioned on the step.

30. A module, comprising:
a substrate having a first side and a second side and at least two elongate through-slots extending from the first side to the second side thereof, the at least two elongate through-slots each having a length and a width;
electrical conductors formed on the first side and the second side of the substrate, the electrical conductors having connection terminals adjacent the at least two elongate through-slots for bonding portions of wires to bond pads exposed through the at least two elongate through-slots;
electrical input/output connectors for connecting the electrical conductors to an external circuit;
a first semiconductor die having an active surface with a plurality of bond pads thereon and a reverse surface, a portion of the active surface bonded to the first side of the substrate, at least one bond pad of the plurality of bond pads on the active surface of the first semiconductor die exposed through a through-slot of the at least two elongate through-slots in the substrate for bonding a portion of a wire to at least one of the electrical conductors on the second side of the substrate;
a second semiconductor die having an active surface with a plurality of bond pads thereon and a reverse surface, a portion of the active surface of the second semiconductor die bonded to the second side of the substrate, at least one bond pad of the plurality of bond pads thereon exposed through another through-slot of the at least two elongate through-slots in the substrate for wire-bonding to at least one of the electrical conductors on the first side of the substrate;
at least two conductive wires connecting at least two bond pads of the plurality of bond pads on the first semiconductor die and the second semiconductor die to at least two of the connection terminals, one of the at least two connection terminals located on the first side of the substrate and another of the at least two connection terminals located on the second side of the substrate, the first semiconductor die and the second semiconductor die positioned wherein a conductive wire connected thereto extends through a through-slot of the at least two elongate through-slots in the substrate; and
a flowable, hardenable glob-top material in at least one of the through-slots, the material at least partially encapsulating at least one of the at least two conductive wires therein, the at least one of the at least two conductive wires electrically attached to the first semiconductor die, the glob-top material extending away from the through-slot towards the second semiconductor die, thereby contacting the second semiconductor die.

31. The module of claim 30, further comprising a layer of polymeric sealant encapsulating a portion of the module.

32. The module of claim 30, wherein the first semiconductor die and the second semiconductor die are attached to the substrate at two different planes.

33. The module of claim 30, wherein the electrical conductors on the first side of the substrate have connection terminals adjacent the through-slot of the at least two elongate through-slots in the substrate for wire-bonding to the plurality of bond pads on the first semiconductor die attached to the second side of the substrate, and the electrical conductors on the second side of the substrate have connection terminals adjacent the another through-slot of the at least two elongate through-slots for wire-bonding to the plurality of bond pads on the second semiconductor die attached to the first side of the substrate.

34. The module of claim 30, wherein the electrical conductors comprise metallization patterns on the first and second sides of the substrate.

35. The module of claim 30, further comprising:
conductive vias through the substrate connecting the electrical conductors on the first side and the second side of the substrate.

36. The module of claim 30, wherein the electrical input/output connectors comprise a ball-grid-array of solder balls on one of the first and second sides of the substrate.

37. The module of claim 30, wherein the electrical input/output connectors comprise an edge connector.

38. The module of claim 30, wherein the electrical input/output connectors comprise a socket connector.

* * * * *